United States Patent [19]

Iwanami et al.

[11] Patent Number: 5,045,686
[45] Date of Patent: Sep. 3, 1991

[54] SEMICONDUCTOR OPTICAL-READING DEVICE

[75] Inventors: Eiichi Iwanami; Kawahara Yukito; Hiroshi Mukainakano, all of Tokyo, Japan

[73] Assignee: Seiko Instruments Inc., Japan

[21] Appl. No.: 489,452

[22] Filed: Mar. 6, 1990

Related U.S. Application Data

[60] Continuation-in-part of Ser. No. 177,829, Mar. 23, 1988, Pat. No. 4,906,856, which is a division of Ser. No. 799,413, Nov. 19, 1985, abandoned.

[30] Foreign Application Priority Data

Nov. 20, 1984 [JP] Japan ................. 59-245601

[51] Int. Cl.⁵ ............................................. H01J 40/14
[52] U.S. Cl. ............................. 250/208.1; 358/213.23
[58] Field of Search ............ 250/208.1, 211 R, 211 J; 358/213.22, 213.23, 213.28; 357/30 H

[56] References Cited

U.S. PATENT DOCUMENTS 4,644,411  2/1987  Sato et al. ................. 250/208.1
4,695,716  9/1987  Tandon et al. ............. 250/208.1
4,860,075  8/1989  Araghi et al. .............. 250/208.1

*Primary Examiner*—David C. Nelms
*Attorney, Agent, or Firm*—Bruce L. Adams; Van C. Wilks

[57] ABSTRACT

A semiconductor reading device comprises an insulated substrate and a plurality of integrated circuit reading chips disposed on the substrate. Each reading chip comprises a semiconductor substrate containing thereon a plurality of bipolar phototransistors which are responsive to incident light for producing video signals. The phototransistors are formed in the surface of the semiconductor substrate and are equidistantly spaced from one another in a longitudinal direction of the semiconductor substrate. A plurality of signal transmitting elements in the form of MOS transistor are connected to respective ones of the phototransistors and are switchable between a conducting state to transmit therethrough the video signal from its corresponding phototransistor and a non-conducting state. A multi-stage shift register sequentially switches the signal transmitting elements from the non-conducting state to the conducting state to sequentially read out the video signals from the phototransistors. The reading chips are spaced from one another in the longitudinal direction of the semiconductor substrate such that the two endmost phototransistors, which are adjacent each other on two adjacent reading chips, are spaced apart a distance equal to the equidistant spacing between the phototransistors on the reading chips to thereby define a longitudinal array of equi-distantly spaced phototransistors.

12 Claims, 5 Drawing Sheets

United States Patent Office

PTO - BOYERS, PA Duty Station

MISSING PAGE TEMPORARY NOTICE

PATENT # 5045686 FOR ISSUE DATE 9-3-1991

HAS BEEN SCANNED, BUT WITH MISSING PAGE(S). UPON RECEIVING OF MISSING PAGE(S), THE ENTIRE DOCUMENT WILL RE RESCANNED. PLEASE CALL IMAGE DATA ADMINISTRATION STAFF OF 557-6154 IF YOU HAVE A QUESTION. ASK FOR DAVE GROOMS, ANITA YOUNG OR POLA JONES.

THIS NOTICE IS FOR THE MISSING PAGE CONTAINING:

All drawings

Data Conversion Operation
Boyers, Pa

SEMICONDUCTOR OPTICAL-READING DEVICE

RELATED APPLICATION

This application is a continuation-in-part of application Ser. No. 177,829 filed Mar. 23, 1988 and now U.S. Pat. No. 4,906,856 which, in turn, is a division of application Ser. No. 799,413 filed Nov. 19, 1985 and now abandoned.

BACKGROUND OF THE INVENTION

The present invention relates to semiconductor devices for converting reflected light from a manuscript paper into an electric signal. The present invention especially relates to a semiconductor reading device which can conduct contact reading with a light-receiving portion which corresponds to the manuscript in its measurement by one to one.

FIG. 1 shows a typical diagram of a conventional contact reading type device. As shown in FIG. 1, the contact reading device is composed of a photo cell array 22 consisting of amorphous silicon or the like disposed on an insulative substrate 21 such as glass or alumina; IC chips 23 provided with either a function to successively read the electric output of a photo cell, or a function to amplify the electric output even more; and a wiring group 24 which connects the photo cell array 22 and the IC chips 23.

In a case when a conventional contact reading semiconductor device reads an A4 size manuscript, if a resolution corresponding to 8 dots is necessary to read a 1 mm portion of the manuscript, approximately 2000 photo cells arranged at intervals of 125 μm will be necessary. Therefore, the number of wirings to pick up the signal from each photo cell becomes very large, and thus more than ten ICs for conducting signal processing will be necessary. As a result, the process to connect the wiring and the IC chips is difficult, and this is a factor which reduces the yield. Furthermore, the wiring group 24 is formed so that the IC chips 23 can be mounted on the insulative substrate 21, the required area of the insulative substrate necessary for the wiring being several ten times compared to the total area of photo cell array 22, and this will cause a reduction in the ability to manufacture at low cost. Also, as the wiring connecting the photo cells and the ICs must be made of different lengths, their wiring capacity and wiring resistance differ, affecting the obtained signal, and the signal processing circuit to correct the effect will be complicated and thus high accuracy will be difficult.

SUMMARY OF THE INVENTION

It is an object of the present invention to provide a semiconductor reading device comprised of a plurality of IC reading chips each comprising bipolar phototransistors, drive circuits composed of MOS transistros and a shift register, all being integrated in a conductive single-crystal substrate with individual like elements lying along a straight line and linearly spaced from one another at the same interval.

BRIEF DESCRIPTION OF THE DRAWINGS

FIG. 1 is a perspective view of an embodiment of a prior art semiconductor reading device;

FIG. 2 is a sectional diagram of an embodiment of part of a semiconductor reading device of the present invention;

FIG. 3a is an equivalent circuit diagram of part of the semiconductor reading device of the present invention;

FIG. 3b is an explanatory circuit diagram showing the relation between the parts in FIGS. 2 and 3a;

FIG. 4 is a schematic view of an embodiment of semiconductor reading device of the present invention;

FIG. 5 is a schematic view of one photoelectric conversion array shown in FIG. 4; and FIG. 6 is a timing chart for explaining the operation of the semiconductor reading device shown in FIG. 4.

DETAILED DESCRIPTION OF THE PREFERRED EMBODIMENTS

FIG. 2 is a sectional diagram of an embodiment of part of the semiconductor reading device of the present invention. Referring to FIG. 2a, numeral 1 is a P conductive type substrate. Numeral 2 is a selectively formed N type built-in layer of high impurity density and, to keep the surface impurity density to $5 \times 10^{18}$ atoms/cm$^3$, for example, antimony is diffused within the N type built-in layer 2. Numeral 3 is an N type epitaxial layer having an impurity density of $5 \times 10^{14}$ to $6 \times 10^{14}$ atoms/cm$^3$ and a thickness approximately 5 to 15 μm to form a major surface portion of the semiconductor substrate. Numeral 4 is a P type separating or insulating layer formed to a depth sufficient to reach the P type substrate 1 from the surface of epitaxial layer 3, the separating layer 4 being formed to surround and border each and every one of the later-mentioned phototransistors. Also, it is desirable to set the width of the P type separating layer between the adjacent phototransistors to be more than 40 μm when the resolution for reading the manuscript is 8 dots/mm, (8 dots are necessary to read a 1 mm long portion of the manuscript), and it is desirable to set the width to be more than 20 μm when 16 dots/mm resolution is required.

Numeral 5 is a P well of an N channel MOS transistor, its surface impurity density being $1 \times 10^{16}$ atoms/cm$^3$, and its depth being 3 to 8 μm. Numeral 6 is the base region of the phototransistor, its surface impurity being $1 \times 10^{16}$ to $1 \times 10^{18}$ atoms/cm$^3$ and its depth being 1.5 to 5 μm. This base region 6 can be formed simultaneously with the P well 5. Numerals 7 and 7' show drain and source regions of a P channel MOS transistor, their impurity density being high and formed as a P conductive type. Numerals 8 and 8' show source and drain regions of an N channel MOS transistor being formed in the P well 5 with high impurity density of N conductive type. The surface impurity density of the source and drain regions of the MOS transistors are both more than $1 \times 10^{19}$ atoms/cm$^3$, and their depth is 0.1 to 3.0 μm. Numeral 9 is an emitter region of the phototransistor formed within the base region 6 to form therebetween a PN junction, its surface impurity density being $1 \times 10^{19}$ atoms/cm$^3$ and its depth being 0.1 to 3.0 μm. Numeral 10 is a collector region of the phototransistor, formed on the surface of the epitaxial layer 3 with the same density profile. Numerals 11 and 12 are respectively gates of the N channel and P channel MOS transistors, formed by phosphorous-doped or boron-doped polycrystalline silicon.

Numeral 13 is metal wiring defining an electrode region composed of aluminum and which has the main connecting function to electrically connect the above respective regions. As the metal wiring 13 usually reflects or absorbs light, it is not desirable to cover the base region 6 of the phototransistor. Therefore, the covered area of the base region should be less than half of the whole area. Numeral 14 is a passivation film made of $SiO_2$, $Si_3N_4$ and the like, its thickness being about 1 to 2 $\mu$m. Furthermore, the scattering of the phototransistor output should be made small when outputting an 8- or 16-value signal as compared to outputting a 2-value signal.

The arrangement of the plurally formed phototransistors is as follows. When the requirement for the resolution of reading is 8 dots/mm, the arrangement pitch in the lateral direction relative to the manuscript paper between the adjacent phototransistors is 125 $\mu$m, but its actual pitch can be permitted to 95 $\mu$m at its maximum when considering the mutual interference between the phototransistors and cutting accuracy. Its lateral dimension will be 10 $\mu$m at its minimum, because of lithography technology and the limitation of the output of the phototransistors. The dimension in the longitudinal direction with respect to the longitudinal substrate 1 will be 125 $\mu$m at its maximum from the limitation of the pitches, and its minimum dimension is 50 $\mu$m because of the limitation of the phototransistors.

On the other hand, as shown in FIG. 5, when the requirement for the resolution of reading is 16 dots/mm, the arrangement pitch in the lateral direction between the adjacent phototransistors P will be 62.5 $\mu$m. But actually, as in the case of 8 dots/mm, the lateral dimension should be 10 $\mu$m to 32.5 $\mu$m, and the longitudinal dimension should be 25 to 62.5 $\mu$m. Also, the valid base region of the phototransistor that receives and senses the incident light will be the region where the incident light is not shut out by the metal layer.

The phototransistors described above are formed by utilizing such semiconductor circuit manufacturing methods as ion implantation, thermal diffusion, photolithography, vapor phase epitaxial growth, chemical vapor deposition, vacuum evaporation, and sputtering.

In the above explanation of the basic fundamental structure, instead of the photo transistor and MOS transistor structures described, the reverse conductive type transistors can be utilized. Also, the drive circuit composed of N channel and P channel MOS transistors can be replaced simply by an N channel transistor. Also, the gate of the MOS transistor can be formed by metal such as aluminum. On the surface of the single crystal below the gate, phosphorous or phorone may be ion-implanted to control the threshold voltage of the channel region.

FIGS. 3a and 3b are equivalent and explanatory circuit diagrams of part of the semiconductor reading device of the present invention. A plurality of phototransistors $P_1, P_2 \ldots, P_n$ have their collectors connected to a high potential ground, their bases in a floating state and their emitters connected to the drive circuit side of the MOS transistors. Signal transmitting elements $S_1, S_2 \ldots, S_n$ consisting of analogue switches of the MOS transistors are connected to respective emitters of the phototransistors $P_1, P_2 \ldots, P_n$. Shift register stages $SR_1, SR_2 \ldots, SR_n$ are connected sequentially to turn on or enable the respective switches $S_1, S_2 \ldots, S_n$, and an amplifier AMP may be provided for effecting current-voltage conversion at terminals to which the output of the plurality of switches $S_1, S_2 \ldots, S_n$ are connected. When the amplifier AMP is not utilized, the OFF SET is especially small, and bipolar transistors with high gain and very efficient frequency characteristic can be utilized.

As shown in FIG. 3a, the bipolar transistor P corresponds to the base 6, emitter 9 and collector 10 shown in FIG. 2. The drain 8, source 8' and gate 11 shown in FIG. 2 correspond to the signal transmitting element S shown in FIGS. 3a and 3b. The line a shown in FIG. 2 corresponds to the line a shown in FIGS. 3a and 3b. The lines $a_1$ and $a_2$ connected to line a in FIG. 3b are connected to the source 8' and source 7 of the signal transmitting element S in FIG. 2, respectively. The line b shown in FIG. 2 corresponds to the line b connected to the output terminal of the amplifier AMP shown in FIGS. 3a and 3b.

An explanation of the operation of the semiconductor reading device of the present invention will be given referring to FIG. 3. The reflected light on the manuscript is irradiated onto the phototransistors $P_1, P_2 \ldots, P_n$. When the part of the manuscript detected by the phototransistor $P_1$ is white, a very strong light incidence will occur. Therefore holes and electrons are generated in the phototransistor $P_1$. By the potential generated at the PN junction, the holes and electrons are accumulated to the base and the epitaxial layer, respectively. The PN junction is formed by the base region and the active collector region in the epitaxial layer. This operation is conducted during a time equal to the time necessary to read one line of the manuscript.

Next, when the channels of the switch $S_1$ are turned on by the output or control voltage of the shift register stage $SR_1$ applied to the gates of the switch $S_1$, the phototransistor $P_1$ switches to the bias condition from the floating condition, and thus the emitter of the phototransistor is connected to the input terminal of the amplifier AMP through the channels of the switch $S_1$. Therefore, by the accumulation of holes, the base of the phototransistor becomes the same condition as it is biased forward relative to the emitter and, by the potential applied to the collector, a relatively large photoelectric current passes from the collector to the emitter through the switch and to the input terminal of the amplifier AMP and a large voltage is produced at the output terminal of the amplifier AMP.

On the other hand, if the manuscript portion corresponding to the phototransistor $P_1$ is black, the irradiation light to this phototransistor will be weak, and almost no holes or electrons are accumulated on the base and the epitaxial layer of the phototransistor $P_1$. Therefore, even when the switch $S_1$ is turned on, almost no electric current passes, and the voltage produced at the output terminal of the amplifier AMP will be small. If the color of the manuscript is grey, a corresponding current of the phototransistor passes, and an output voltage having a medium level between the output at white color and the output at black color is produced at the output terminal of the amplifier AMP. The above operation is successively repeated for each of the phototransistors $P_1, P_2 \ldots, P_n$ arranged in the direction relative to the manuscript paper.

The output current obtained at the phototransistors $P_1, P_2 \ldots, P_n$ is approximately two figures larger than the electric current generated at photo cells, such as amorphous silicon photo diodes or PN photo diodes formed in an identical area, and so by utilizing the phototransistors $P_1, P_2 \ldots, P_n$, the effect of noise generated at the switches $S_1, S_2 \ldots, S_n$ will be relatively small. Also, as the large wiring capacity due to the connecting wiring from a plurality of phototransistors to the amplifier AMP can decrease the overall number of wirings, the sensitivity of the whole semiconductor reading device will not be much reduced.

FIGS. 4-6 show in diagrammatic form an embodiment of semiconductor reading device according to the present invention. A plurality of linear image sensor integrated circuits (ICs) $A_1, A_2 \ldots, A_k$ are formed in a line on the insulated substrate 1 in order to obtain a wide reading width as shown in FIG. 4. The insulated substrate has lead lines formed on its surface. By using these lead lines, electric power is applied to all of the linear image sensors $A_1, A_2 \ldots, A_k$, and input signals are applied to selected input terminals to drive the shift registers $B_1, \ldots, B_k$ and to scan the signal transmitting elements $S_{11} \ldots, S_{kn}$. Video output signals $SIG_1, SIG_2 \ldots, SIG_k$ are read out from output terminals $C_1, C_2 \ldots, C_k$.

Two output signals are supplied to the image sensor ICs $A_1, \ldots, A_k$. One input signal is a clock signal CK (FIG. 6) which is applied to all of the image sensor ICs $A_1, \ldots, A_k$. The shift registers $B_1, \ldots, B_k$ are driven by the clock signal CK. The other input signal is a serial in data signal SI which is applied to the shift register $B_1$ of the first image sensor IC $A_1$. After the signal SI is applied to the first stage $SR_{11}$ of the shift register $B_1$, it is transmitted in the shift register $B_1$ by synchronizing the clock signal CK to scan the signal transmitting elements $S_{11}, \ldots S_{1n}$. Therefore, the video signal $SIG_1$ shown in the timing chart of FIG. 6 is applied to the output terminal $C_1$ from the phototransistors $P_{11}, \ldots, P_{1n}$.

Each waveform of the video signal $SIG_1$ is revised by the switching operation of a controller $D_1$ as shown in the timing chart of FIG. 6, that is, the waveforms shown in broken lines are revised to the waveforms shown in solid lines, because the output terminal $C_1$ is connected to the power source line E for the time $T_1, \ldots, T_n$ by the switching operation of the controller $D_1$. The switching operation described above is done by applying the clock signal CK to the controller $D_1$ as shown in FIG. 4. The serial in data signal SI from the final stage $SR1_n$ of the shift register $B_1$ is applied to the first stage $SR_{21}$ of the shift register $B_2$ as shown in FIG. 4, and the signal is transmitted in the shift register $B_2$ by synchronizing the clock signal CK to scan the signal transmitting elements $S_{21}, \ldots, S_{2n}$.

Therefore, a video signal $SIG_2$ shown in the timing chart of FIG. 6 is applied to the output terminal $C_2$ from the phototransistors $P_{21}, \ldots, P_{2n}$. Each waveform of the video signal $SIG_2$ is revised by the switching operation of a controller $D_2$. In the same manner as described above, a video signal $SIG_k$ applied to an output terminal $C_k$ from the phototransistor $P_{k1}$ is revised by the switching operation of a controller $D_k$. The sum of the video signals $SIG1, \ldots, SIG_k$ is applied to the amplifier AMP.

As shown in FIGS. 4-5, the ICs $A_1, A_2 \ldots, A_k$ are laterally spaced apart from one another so that the spacing between the two endmost phototransistors P on each two adjacent ICs A is equal to the equi-distant spacing between the respective phototransistors. Thus the distance between the last phototransistor $P_{1n}$ on the IC $A_1$ and the first phototransistor $P_{21}$ on the IC $A_2$ is equal to the distance between the respective phototransistors on the ICs $A_1$ and $A_2$. This distance may, for example, be 125 μm for a resolution of 8 dots/mm and 62.5 μm for a resolution of 16 dots/mm. According to the present invention, the distance between the last phototransistor on a preceding IC and the first phototransistor on a succeeding IC is equal to the uniform distance between the phototransistors on the respective ICs. In this manner, the phototransistors P on all of the ICs $A_1, A_2 \ldots, A_k$ jointly define a linear array of equidistantly spaced phototransistors. Thus the phototransistors in the linear array have a uniform pitch regardless of the number of ICs used to form the array.

The present invention utilizes the bipolar phototransistor as its photo cell, and so the sensitivity is one figure larger than the conventional diode type photo cell. Therefore, the area of the photo cell portion may be small, and as a result, there will be allowance for the cutting of the chips. Further, an oblong-shaped or longitudinal reading device can be easily obtained at low cost by directly connecting a plurality of chips in the lateral direction relative to the manuscript paper. Also, by integrating the phototransistors and drive circuits into a single crystal substrate in a monolithic style, the wiring which connects the phototransistors and the drive circuit can be made short and uniform. Therefore, the sensitivity improves and the scattering of the output reduces. With the conventional ICs, there are problems wherein the dimension has to be 16 dots/mm because individual drive circuits are connected with wire bonds and such, or wherein the connection is extremely difficult because of colorization, but these problems are simultaneously solved with the present invention.

As explained hereinabove, with the present invention, it is possible to obtain low price and small-sized contact reading devices for reading manuscripts, and so multi-function capability and high efficiency can be obtained for a facsimile, multi-purpose scanner, word processor and the like. Therefore, the present invention can contribute significantly to the developement of electronic instruments.

Furthermore, with the present semiconductor reading device, as the phototransistors and drive circuits are formed on the same single crystal substrate, the wiring to connect the two parts can be easily done simultaneously with the wiring of the drive circuit, the length will be shortened, and it is possible to use wiring having the same shape and length. Also, as the sensitivity of the phototransistor is one figure larger than that of the conventional photo cell, not only the construction of the amplifier is made simple but also the circuit operation is carried out at high speed.

We claim:

1. A semiconductor reading device comprising:
   an insulated substrate;
   a plurality of IC reading chips disposed on the insulated substrate, each IC reading chip comprising
   a semiconductor substrate having a major surface portion,
   a plurality of bipolar transistors for producing video signals in response to incident light, the bipolar transistors being formed in the substrate major surface portion and being equi-distantly aligned in the longitudinal direction of the substrate, and
   drive means arranged parallel to the bipolar transistors, the drive means comprising a plurality of signal transmitting elements and shift register means, each of the signal transmitting elements being connected to a respective one of the bipolar transistors, and the shift register means being coupled to the signal transmitting elements for sequentially reading the video signals from the bipolar transistors;

and wherein the distance between the two adjacent bipolar transistors of each two respective adjacent IC reading chips is the same as the distance between the bipolar transistors arranged on the semiconductor substrates.

2. A semiconductor reading device according to claim 1; wherein the shift register means comprises a plurality of stages.

3. A semiconductor reading device according to claim 1; wherein the signal transmitting elements comprises MOS transistors.

4. A semiconductor reading device comprising: an insulated substrate; and a plurality of integrated circuit reading chips disposed on the substrate, each reading chip comprising a semiconductor substrate, a plurality of phototransistors responsive to light incident thereon for producing video signals, the phototransistors being formed in a major surface portion of the semiconductor substrate and being equi-distantly spaced from one another in a longitudinal direction of the semiconductor substrate, a plurality of signal transmitting elements connected to respective ones of the phototransistors and being switchable between a conducting state to transmit therethrough the video signal from its corresponding phototransistor and a non-conducting state, and means for sequentially switching the signal transmitting elements from the non-conducting state to the conducting state to sequentially read out the video signals from the phototransistors; and wherein the plurality of reading chips are spaced from one another in the longitudinal direction of the semiconductor substrate such that the two endmost phototransistors which are adjacent each other on each two adjacent reading chips are spaced apart a distance equal to the equi-distant spacing between the phototransistors on the reading chips to define a longitudinal array of equi-distantly spaced phototransistors.

5. A semiconductor reading device according to claim 4; wherein the means for sequentially switching the signal transmitting elements comprises shift register means.

6. A semiconductor reading device according to claim 5; wherein the shift register means comprises a multi-stage shift register having a plurality of stages each connected to one of the signal transmitting elements.

7. A semiconductor reading device according to claim 6; wherein the signal transmitting elements comprise MOS transistors.

8. A semiconductor reading device according to claim 7; wherein the phototransistors comprise bipolar transistors.

9. A semiconductor reading device according to claim 6; wherein the phototransistors comprise bipolar transistors.

10. A semiconductor reading device according to claim 4; wherein the signal transmitting elements comprise MOS transistors.

11. A semiconductor reading device according to claim 10; wherein the phototransistors comprise bipolar transistors.

12. A semiconductor reading device according to claim 4; wherein the phototransistors comprise bipolar transistors.

* * * * *